United States Patent [19]
Bhagat

[11] Patent Number: 4,611,235
[45] Date of Patent: Sep. 9, 1986

[54] THYRISTOR WITH TURN-OFF FET

[75] Inventor: Jayant K. Bhagat, Troy, Mich.

[73] Assignee: General Motors Corporation, Detroit, Mich.

[21] Appl. No.: 617,106

[22] Filed: Jun. 4, 1984

[51] Int. Cl.[4] .................... H01L 29/72; H01L 27/06; H01L 29/08; H01L 29/06
[52] U.S. Cl. ...................... 357/38; 357/43; 357/56
[58] Field of Search .............. 357/38, 43, 56

[56] References Cited

U.S. PATENT DOCUMENTS 3,891,866  6/1975  Okuhara et al. ............. 307/252 C

FOREIGN PATENT DOCUMENTS 2524711  10/1983  France .......................... 357/43
0228793   1/1980  U.S.S.R. ........................ 357/38

OTHER PUBLICATIONS

Perner et al., "MOS Gate Turn-Off Lateral SCR", *IBM Tech. Discl. Bull.*, vol. 20, No. 6, Nov. 1977, pp. 2273-2274.

Russell et al., "The COMFET-A New High Conductance MOS-Gated Device", *IEEE Electron Device Letters*, vol. EDL-4, No. 3, Mar. 1983, pp. 63-65.

Primary Examiner—Andrew J. James
Assistant Examiner—John Lamont
Attorney, Agent, or Firm—Robert J. Wallace

[57] ABSTRACT

A new semiconductor power device, suitable for electrical switching in automotive applications, is proposed. This device combines the low specific on-resistance achievable with bipolar regenerative switching devices with the convenience of insulated gate control of not only turn-on but also turn-off. A device structure is presented that also includes a pinch resistance effect to more rapidly produce turn-off.

7 Claims, 5 Drawing Figures

THYRISTOR WITH TURN-OFF FET

FIELD OF THE INVENTION

This invention relates to thyristor structures and more particularly to a dual gate silicon controlled rectifier in which one gate is used for device turn-on and the other gate is used for device turn-off.

BACKGROUND OF THE INVENTION

Numerous semiconductor devices can be used as power switches. These devices include thyristors, bipolar junction transistors, junction field effect transistors, insulated gate field effect transistors, field controlled thyristors, insulated gate controlled thyristors, and bipolar mode conductivity modulated field effect transistors. The choice of which device is preferred for a particular application is a function of many factors. These factors include the desired current handling capability of the device, the forward and reverse blocking voltages desired, turn-on and turn-off time desired, typical and maximum switching frequencies desired, circuit environment considerations such as resistive/inductive loads encountered, drive requirements, cost, etc.

Some applications of power switches require switching of low voltages at high currents. For example, automotive applications require switching of approximately 12 volts at currents of about 10–100 amperes. Using semiconductor devices rather than electromechanical relays to do this switching offers advantages of reliability, cost and ease of use in interfacing with control circuitry. Such advantages are obviously significant.

There are several characteristics which are particularly desirable in thyristor devices used for automotive switching applications. Such characteristics include a grounded cathode for compatibility with the automotive electrical system and control by means of low current and low positive voltages. This provides simpler interfacing and better electrical compatibility with other circuits in the automotive system. In addition, it is desired that the thyristor not only be rapidly turned on, but also rapidly turned off, by the low power positive control voltages. Low cost is very important too. In order to achieve low cost, a high current density device with a low on-resistance is desired. This minimizes silicon chip area in the device and thereby improves yields, while keeping heat sinking and packaging costs to a minimum.

The known type of thyristor having an insulated gate for turn-on has most of the foregoing desirable features. However, it cannot be turned off unless current density drops to a very low value. I have found how to add an insulated gate to such a device that provides rapid turn-off even when anode voltage stays high.

OBJECTS AND SUMMARY OF THE INVENTION

It is an object of this invention to provide a dual gate grounded cathode thyristor in which one gate turns the thyristor on and the other turns the thyristor off.

Another object of the invention is to provide a new semiconductor power device suitable for electrical switching in automotive applications.

A further object of the invention is to provide a semiconductor power device having low specific on-resistance characteristic of bipolar regenerative switching devices, in combination with the convenience of insulated gate control of both turn-on and turn-off.

The invention comprehends a dual gate thyristor in which a turn-on gate is part of a first integtrated insulated gate field effect transistor (IGFET) and a turn-off gate is part of a second integrated insulated gate field effect transistor (IGFET). The thyristor further includes a pinch resistance effect for accelerating turn-off, which effect is produced by a ring-like source region of the second IGFET that encircles an internal region of the thyristor.

BRIEF DESCRIPTION OF THE DRAWING

Other objects, features and advantages of this invention will become more apparent from the following description of preferred examples thereof and from the drawing, in which.

DESCRIPTION OF THE PREFERRED EMBODIMENTS

This invention comprehends a PNPN rectifier structure that has a grounded cathode and two insulated control gates, one for turn-on and one for turn-off. I refer to the rectifier as a thyristor since it is fundamentally a bipolar type of device that uses conductivity modulation to handle high current densities and provide a low specific on-resistance. The control gates are actually gate electrodes of separate integral insulated gate field effect transistors (IGFETs) and controlled with positive electrical potentials. In addition, my thyristor structure provides a pinch resistance, analogous in operation to a junction field effect transistor that is activated by the turn-off control gate. As hereinbefore mentioned, insulated gates have been used to turn-on thyristors. However, such thyristors can only be turned off when current density drops to a low value. My thyristor additionally has a second insulated gate and a pinch resistance to provide turn-off even though current density does not decrease. The extra complexity introduced into the structure by using two control terminals and the pinch resistance is not considered to be significant when one considers the advantage obtained, particularly for microprocessor controlled applications.

Figure 1:
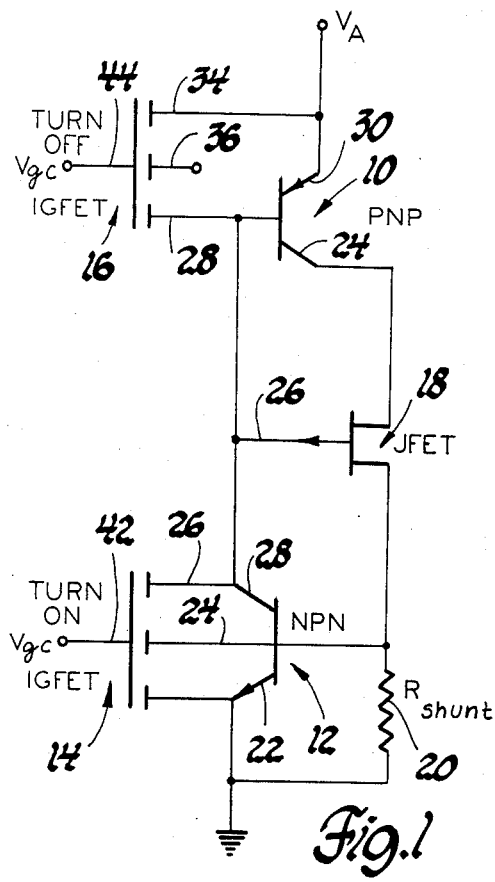
FIG. 1 shows an electrical schematic of the thyristor of this invention.

Reference is now made to FIG. 1, which shows an electrical schematic that represents the integrated electrical devices inherent to my thyristor. My thyristor can thus be considered as including a PNP transistor 10, an NPN transistor 12, a first insulated gate field effect transistor (IGFET) 14, and a second insulated gate field effect transistor (IGFET) 16. It also includes a pinch resistance, which I prefer to refer to as a junction field effect transistor (JFET) 18. FIG. 1 also shows a resistance 20, that is identified as $R_{shunt}$. Resistance 20 is an internal resistance, between the emitter and the base of the NPN transistor, that is used in the normal and accepted way to produce device turn-on when IGFET 14 is activated.

Figure 2:
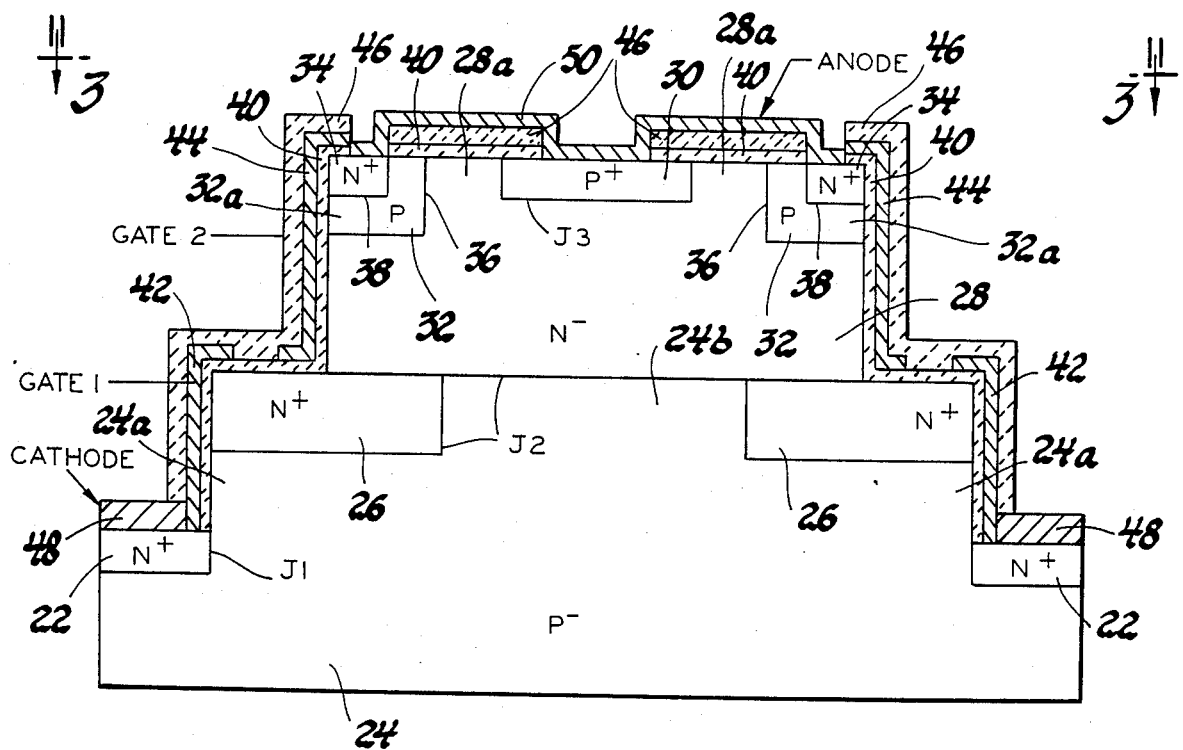
FIG. 2 shows a cross-sectional view of a thyristor made in accordance with this invention.

Reference is now made to FIG. 2 which shows a specific embodiment of the thyristor electrically represented by FIG. 1. The structure shown in FIG. 2 is fundamentally concentric. Hence, it is symmetrical about its vertical centerline. In particular, FIG. 2 shows a rectangular P− silicon body member 24 that is symmetrical about its center line and includes two circumferential steps, i.e. reduced cross-section zones, on its edge. The tred-portion of the lowest step on silicon body 24 has a ring-like N+ region 22 on its circumference. The tred-portion of the middle step on the P− body 24, has a middle ring-like N+ region 26. It can also be considered that the middle N+ ring 26 is disposed on the periphery of the upper surface of P− body, so that it encircles a portion 24b of body 24 on the upper surface of body 24. A spacing between the lower N+ ring 22 and the middle N+ ring 26 should be maintained to insure that there is adequate shunt resistance 20 between junction J2 and cathode 22. For a doping level of about $1 \times 10^{14}$ or $1 \times 10^{15}$ impurity atoms per cubic centimeter in P− region 24, I would like this spacing to be at least of the order of 10 micrometers, preferably 30. An N− epitaxial layer 28 of the order of about 500-1000 micrometers wide and about 20-50 micrometers thick is disposed on the upper surface of the P− body 24, over its central portion 24b and overlapping onto the inner circumferential portion of the middle N+ region 26. N− layer 28 could have a doping level of about $1 \times 10^{14}$ or $1 \times 10^{15}$ impurity atoms per cubic centimeter. The preferred width of layer 28 depends on the current capability desired for the device and the bonding wire diameter that is to be used. The preferred thickness of layer 28 depends upon the voltage breakdown. The range in width and thickness given is intended for a 5 ampere, 100 volt device. An island-like P+ region 30 is centrally disposed on the upper surface of the N− epitaxial layer 28. The P+ and N+ doping levels can be about $1 \times 10^{19}$ to $1 \times 10^{20}$ impurity atoms per cubic centimeter in my device.

The lower N+ ring 22 forms a PN junction, identified as J1, with the P− body portion 24. The P− body portion 24 forms a second PN junction, identified as J2, with the middle N+ ring 26 and the N− epitaxial layer 28. The epitaxial layer 28 forms a third PN junction, identified as J3, with the island-like region 30. Junctions J1 and J2 comprise the NPN transistor 12. Junctions J2 and J3 comprise the PNP transistor 10.

Accordingly, it can be considered that the lower N+ ring 22 is an emitter region for the NPN transistor 12, while the P+ region 30 is the emitter region for the PNP transistor 10. The P− body portion 24 can be considered as being both the base region of the NPN transistor and the collector region of the PNP transistor. Analogously, the middle N+ ring 26 and its contiguous N− epitaxial layer 28 can be considered as being both the collector region of the NPN transistor 12 and the base region of the PNP transistor 10.

The upper surface of the epitaxial layer 28 has a circumferential P-type ring 32 on its outer periphery, outwardly spaced from the P+ island 30. Accordingly, the P-type ring 32 forms a concentric ring around the P+ island region 30, with a portion 28a of the epitaxial layer 28 between them. An N+ circumferential ring 34 is nested wholly within the outer periphery of the P-type ring 32. It thus forms a third and upper N+ ring, that is disposed on the top step of the device structure. This top step is the outer edge of the upper surface of the epitaxial layer 28. A PN junction 36 separates the P-type ring 32 from the epitaxial layer 28. A PN junction 38 separates the upper N+ ring 34 from its surrounding P-type ring 32.

A 1000-10,000 angstroms thick silicon dioxide film 40 of IGFET gate quality covers the top and sides of the epitaxial layer 28 and the silicon body 24. This silicon dioxide layer need not be uniform on the top and sides of the epitaxial layer 28 and the silicon body 24. On the sides of layer 28 and body 24 it can be thinner than on top of layer 28. The silicon dioxide film 40 is a dielectric that is suitable as a gate electrode dielectric for an insulated gate field effect transistor. A first circumferential polycrystalline silicon electrode 42 is disposed on the middle step and on the contiguous riser portion, i.e. side wall, of the body 24 beneath it. Thus, it extends from the N+ lower ring 22 up to the N+ middle ring 26. A second circumferential polycrystalline silicon electrode 44 is disposed on the middle and top steps and on the interjacent riser portion, i.e. side wall, of the epitaxial layer 28 therebetween. Thus, it extends from the N+ middle ring 26 to the upper N+ ring 34. These polycrystalline silicon electrodes can be formed by a single polycrystalline silicon layer followed by a proper delineation process to separate the electrodes.

A phosphosilicate glass coating 46 covers the dielectric coating 40 and the polycrystalline silicon electrodes 42 and 44. Windows in the dielectric coating 40 and the phosphosilicate glass coating 46 are provided so that a metal electrode 48, referred to herein as a cathode, can make contact with the N+ ring 22 and optionally with the P− body 24 on the bottom step. Windows are also provided in the dielectric coating over the P+ island 30 and over its concentric upper N+ ring 34, so that a metal electrode 50 can selectively make contact with both of the island and the ring. In other words, upper N+ region 34 is electrically in parallel with the PNP emitter region 30 by means of the metal electrode 50. The metal electrode 50 is referred to herein as an anode. In operation, anode 50 is connected to a source of electrical potential that is positive with respect to the electrical potential applied to the cathode 48. In automotive applications, the cathode would be grounded together with the P− body 24.

The IGFET used to turn-on my thyristor is indicated by reference numeral 14. It comprises the lowermost N+ ring 22 as a source region, the middle N+ ring 26 as a drain region, and the interjacent P− body portion 24a as a gate region. The IGFET used for turn-off of the device is formed by the middle N+ ring 26 and the side wall portion of the epitaxial layer 28 as a source region, the upper N+ ring 34 as a drain region, and the interjacent portion 32a as a gate, i.e. channel, region. Polycrystalline silicon electrode 42 forms a gate electrode for turn-on IGFET 14. It thus forms a turn-on control gate for my thyristor. Analogously, polycrystalline silicon electrode 44 forms a gate electrode for turn-off IGFET 16. It thus forms a turn-off control gate for my thyristor, with the P-type ring portion 32a as a gate region.

It should be noted that the middle portion 24b on the upper surface of silicon body 24 projects upwardly into the center of the middle circumferential N+ ring 26. Hence, ring 26 completely encircles portion 24b. It should also be noted that the middle N+ ring 26 has no electrical contact to it. It is allowed to electrically float in accordance with potentials applied to the gate electrodes 42 and 44. It should also be noted that the resistance $R_{shunt}$, indicated by reference numeral 20 in FIG. 1, is an internal resistance in the silicon body region 24 extending from portion 24b to the cathode contact 48. As is previously known for thyristors turned on by means of an insulated control gate thyristors, the shunt resistance 20 is of a value related to the characteristics of the turn-on IGFET that produces turn-on of the thyristor at a predetermined control gate voltage. While shunt resistance 20 should be considered here, it is no more important to this invention than it is to the prior single insulated gate controlled thyristors.

Assuming the thyristor shown in the drawing is in a forward blocking state, with a gate potential applied to neither IGFET, it is turned on when a positive potential is applied to control gate 42. This produces an N-type channel beneath gate electrode 42 that interconnects the N+ regions 22 and 26. Electrons can then flow from the cathode 48 to the N+ region 26 and are finally collected by anode 50. This forward biases the base-emitter junction J3 of the PNP transistor, tending to turn-on the PNP transistor 10. This action provides holes for injection into the base region 24 of the NPN transistor 12 across its emitter-base junction J1. Since the emitter-base junction is already forward biased, the supply of hole current provides base drive to the NPN transistor, tending to turn it on.

The voltage drop across the shunt resistance 20 is sufficient to allow the forward bias of the NPN transistor 12 and emitter-base junction J1. The current gain alpha of each of the two transistors increases as current increases. When the sum of the two alphas exceeds one, regenerative switching to a low voltage, high current state will take place, as is known. Accordingly, for turn-on, my thryristor is similar to the prior single insulated gate thyristors previously referred to. Commercially available versions of these are referred to as COMFETs and as IGTs. I consider that turn-on operation and design principles are similar. For example, in such types of prior art devices, the shunt resistance 20 is of a value, as compared to the conduction characteristics of the turn-on IGFET 14 to forward bias the base-emitter junction of the NPN transistor 12. Since shunt resistance 20 serves a turn-on purpose in this invention similar to what it does in the prior COMFET, the same prior considerations respecting its use should still be observed. This invention does not change them.

In any event, once regenerative switching starts, i.e. the NPN and PNP transistors are latched, current flow occurs in the manner previously described by conventional thyristor theory. In that circumstance, the positive voltage i.e. turn-on voltage, need no longer be applied to the gate electrode 42 of the turn-on IGFET 14, as with some prior art devices. Accordingly, removing the positive voltage from the gate electrode 42 does not turn the thyristor off. Thus, as in a latched-on COMFET, conduction will continue until the anode-cathode voltage difference is no longer sufficient to provide injection across the emitter-base junction of the PNP and/or NPN transistors 10 and 12. In some prior devices, conduction can be stopped, i.e. before anode-cathode potential drops to a low value, by applying a negative potential to an appropriate gate electrode. On the other hand, one neither has to wait until the anode-cathode voltage drops nor has to apply a negative voltage. In my thyristor one can stop negative switching, i.e. turn off the thyristor, by applying a positive potential to the second gate electrode 44, even if the anode-cathode voltage has not dropped at all.

Turn-off of my thyristor is obtained by means of the second IGFET 16. As previously mentioned, turn-off is produced by first turning off IGFET 14, if it was not previously turned off. This is accomplished, of course, by removing the positive potential that was previously applied to gate electrode 42, to turn-on the thyristor. Turn-off of the thyristor can then be accomplished by turning on IGFET 16. IGFET 16 is turned on by applying a positive electrical potential to the gate electrode 44, of the turn-off IGFET 16 that is above a channel threshold value. This produces an N-type channel 32a along the surface of the P-type outer ring 32 beneath the gate electrode 44. The N-type channel provides a low resistance electrical path between the epitaxial layer 28 and the upper N+ ring 34, which is in direct contact with anode 50. Three effects are produced. First, it should be recalled that epitaxial layer 28 serves not only as the collector for the NPN transistor 12, but also as the base region for the PNP transistor 10. Hence, when the voltage on gate 44 is above threshold value, electrons have a parallel path around the base region of the PNP transistor 10 directly to the anode. Secondly, this low current path is electrically in parallel with the base-emitter junction J3 of the PNP transistor 10. Accordingly, the forward bias of the PNP transistor emitter-base junction J3 will be reduced, reducing hole injection across this junction. The attendant hole current flow through the PNP transistor 10 is thus reduced, reducing base drive to NPN transistor 12 that tends to turn it off.

It should be recognized that turn-off gate 44 does not just extend to the N− epitaxial layer 28. It extends completely across the edge of N− epitaxial layer onto the middle N+ ring 26. Thus, the N− channel produced by a positive potential on gate 44 provides a low electrical resistance path between upper N+ ring 34 and middle N+ ring 26. Thirdly, it should be recalled that (a) the upper N+ ring 34 is shorted to anode 50 and (b) the middle N+ ring 26 electrically floats. When the turn-off IGFET 16 is conducting, the electrical potential of the middle N+ ring 26 approaches that of anode 50. The resulting strong reverse bias on the junction J2 produces a space charge region that inhibits current flow through the center portion 24b of the silicon body 24.

More specifically, when the middle N+ ring 26 is at about anode potential, it acts as a junction field effect transistor gate in pinching off the path for hole flow from anode 50 through the P− region to cathode 48. Thus, conductivity modulation of N− region 28 rapidly ceases, to reestablish the nonregenerative condition. Accordingly, I show the pinch resistor as the junction field effect transistor (JFET) 18, in which its source and drain would be the top and bottom of P− region 24b, respectively. In this connection, it should be noted that the principal hole flow would occur from the centrally disposed P+ island-like region 30 which is aligned over the central P− portion 24b. Since the epitaxial layer is only lightly doped, the predominant hole flow will occur from the P+ island 30 directly to the central P− portion 24b aligned beneath it, rather than to the outlying portions of the P− body 24 beneath the middle N+ ring 26. When the positive potential is applied to the turn-off gate electrode 44, the resulting positive field on the side wall of epitaxial layer 28 tends to confine hole flow into the middle of the epitaxial layer 28.

In order to throttle the anode-to-cathode hole current flow in accordance with this invention, it is thus desirable that the emitter 30 of the PNP transistor be centrally located, that the epitaxial layer 28 be lightly doped, and that the P-type body 24 and the N-type epitaxial layer both be lightly doped. On the other hand, such doping is normally inherent to a thyristor. Accordingly, the same type of doping relationships and levels can be used in this invention that would ordinarily be used in any other thyristor. It should be observed, of course, that the middle N+ ring 26 should have an inner diameter that is small enough to completely pinch off current flow through the central P− portion 24b at the field effect produced on the portions 24b at the voltage and current flow at which turn-off is desired. That field effect would depend upon the voltage applied at anode 50, the conductivity of the turn-off IGFET 16, the conductivity of N+ ring 26, current flow from anode to cathode, etc. The inner diameter of my thyristor is thus variable, depending on a plurality of factors. However, for automotive applications, I prefer that the inner diameter of N+ ring 26 be about 4–10 micrometers. This spacing is based on achieving the blocking capability of about 80 volts or higher on the anode.

It should also be mentioned that it is most desirable that the inner diameter of the middle N+ region 26 be larger than the outer diameter of the P+ island region 30, at least by about 10–50 percent. This requirement can be eliminated or made less stringent if a mesh-like N+ region 26 is used instead of a simple ring as mentioned earlier.

Analogously, I prefer that the middle N+ region not project beneath the epitaxial layer 28 significantly more than the most significant electron depletion effect produced by the positive potential applied to the turn-off gate electrode 44, in order to further prevent the middle N+ region 26 from siphening off any significant proportion of the holes injected into the epitaxial region 28 from the PNP emitter region 30. In general I would think that the middle N+ region 26 should not project beneath the epitaxial region 28 more than about 3–15 micrometers. However, experimental results are needed to confirm this.

It should also be recognized that one can ordinarily make a thyristor conductive, i.e. start regenerative switching, by simply increasing the anode-cathode applied voltages. In my thyristor, such an effect can also occur. On the other hand, the pinch effect of the middle N+ ring 26 shields the anode from the cathode. Consequently, my thyristor can withstand higher anode-cathode voltages if one maintains a positive voltage applied to the turn-off gate electrode 44. In fact, I may prefer to always keep a voltage on gate 44 unless I want the thyristor turned on. For example, a COMFET can turn-on simply because of a rapid voltage rise on the anode or if the temperature significantly increases. Such an effect can occur in my device too. However, I can protect against it, by leaving a positive voltage on gate electrode 44.

Once my thyristor goes into the regenerative switching, i.e. latched mode, conduction characteristics of the device become independent of the voltage applied to the turn-on gate electrode 42. Accordingly, the voltage applied to the turn-on gate electrode 42 need not be maintained once the device is latched.

It should also be recognized that N+ region 22 could have inner edge conformations to increase edge length, or be formed on the bottom side of P− body 24. Alternatively such regions could be used in addition to N+ region 22 to increase the electron injection. These alternative or additional regions should be outside the central region, i.e. not directly below region 30, to prevent unintentional latching during turn-off or high temperature operation or when a rapidly rising anode voltage is applied.

Figure 3:
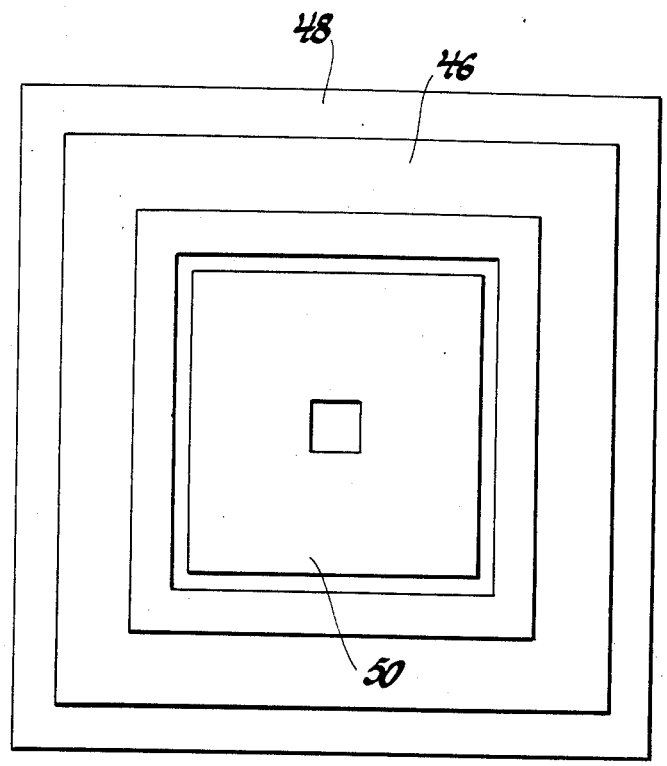
FIG. 3 shows a plan view along the line 3—3 of FIG. 2.
Figure 4:
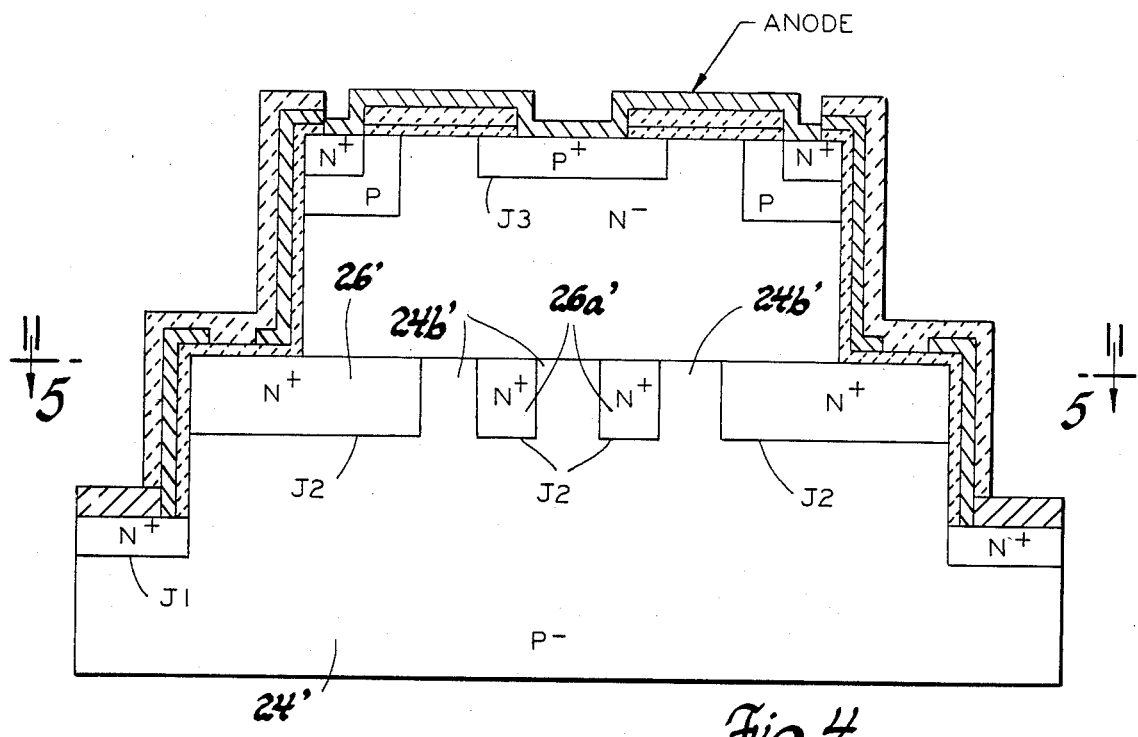
FIG. 4 shows a cross-sectional view of a modification of the thyristor shown in FIGS. 2 and 3.
Figure 5:
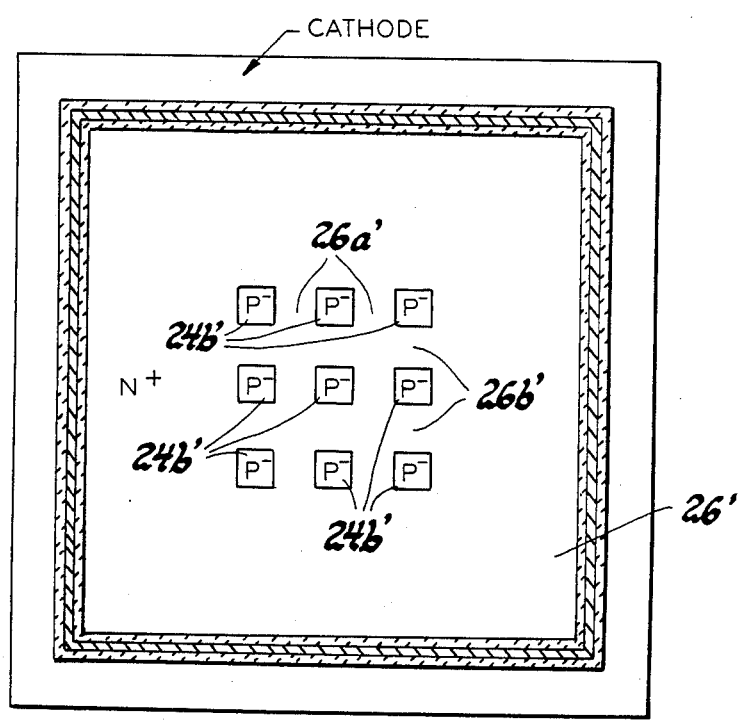
FIG. 5 shows a view along the line 5—5 of FIG. 4.

Analogously, it should also be recognized that a different pattern can be used to form the middle N+ ring 26. One such different pattern is illustrated in FIGS. 4 and 5. In fact, the only difference between the device shown in FIGS. 4 and 5 and the device shown in FIGS. 2 and 3 resides in the pattern of the middle N+ ring 26'. In FIGS. 2 and 3 the middle N+ ring 26 is a simple ring. In the device shown in FIGS. 4 and 5, the middle N+ ring 26' also has a lattice arrangement in its center. This lattice is formed by integral column extensions 26a' and integral row extensions 26b'. The intersecting rows and columns 26a' and 26b' leave a plurality of discrete portions 24b' of the body 24' therebetween. Each of these multiple discrete portions 24b' can form an individual pinch-resistance region in the resultant structure. Accordingly, one can make a very large area device that can have a considerable power rating. Each individual pinch-resistance region 24b' would then preferably have a width of about 4–10 micrometers, as was described in connection with portion 24b of FIGS. 2–3.

It should also be recognized that the N+ middle layer 26' in FIGS. 4 and 5 need not be a lattice. For example, one may choose to only use rows 26a' spaced 4–10 micrometers apart or columns 26b' spaced 4–10 micrometers apart. It should also be recognized that the additional conformations on the inner periphery of the middle N+ layer 26 provides additional emitter edge, which enhances electron injection efficiency for the NPN transistor. Accordingly, the unique configuration of the middle N+ layer not only enhances turn-off characteristics of the device but also should make it turn-on faster.

I wish to mention that my device has been shown as a vertical structure. On the other hand, it is expected that one could make an equivalent device in a horizontal, i.e. lateral, structure. The lateral structure would appear in plan view quite similar to what is shown in cross section in FIG. 2. The most distinctive characteristic would be that one end of the semiconductive film would be of one conductivity type, the other end would be of the opposite conductivity type with anode and cathode disposed at these opposite ends. The principal distinguishing feature would be that there would be an electrically floating middle N+ region connected to turn-on and turn-off IGFETs, to provide a pinch resistance in accordance with this invention.

Still further, I wish to mention that I electrically short drain region 34 to the anode 50 only to provide a convenient and simple source of positive potential for the drain region of the turn-off IGFET 16. One can alternatively provide a separate electrical contact (not shown) to drain region 34 and connect it to a separate source of positive potential (also not shown), which I may choose to refer to as $V_{DD}$. If anode voltage is approximately 80 volts, one can use a potential of only about 8–10 volts on $V_{DD}$. In such event, one need only use a voltage of about 4 or 5 volts on the gate electrode 44 of the turn-off IGFET 16 in order to turn off the entire thyristor. On the other hand, if the drain 34 is electrically shorted to the anode 50 a considerably higher voltage may have to be applied to the gate electrode 44 in order to raise the voltage on N+ region 26 sufficiently to get a rapid turn-off. Use of such a high control voltage may not be desirable in some applications. Accordingly, it may be that one would prefer to have a separate electrical contact for the drain region 34.

This invention involves an electrical pinch effect produced by an electrically floating N+ region 26. The turn-off IGFET 16 is a means for applying a positive voltage to the N+ region 26. Other IGFET structures and other means may be desired to bring up the desired positive potential for turn-off.

Still further it should be recognized that the N+ region 26 could be of any configuration which provides a pinch effect normal to the direction of current carrier flow in the device. This is irrespective of whether the device can be considered as a vertical cylindrical device or as a film (i.e. lateral) device. If it is to be made as a film device, one can provide an N+ region extending from one edge of the film almost across to the other edge, or two opposed regions extending toward one another from opposite edges. In any event, one would leave a small portion of the film forming the PNP collector region that would have a maximum dimension no greater than that which can be pinched off by the voltage being applied to the N+ region, or regions, 26. In other words, the portion of the PNP transistor collector region normal to the direction of current carrier flow would not have a maximum dimension larger than that which could be substantially depleted of carriers by the positive voltage applied to the contiguous N+ region 26. If a higher power device is desired, one can simply use a multiplicity of such pinch regions, such as is inherent to the lattice-type structure shown in connection with FIGS. 4 and 5.

Another alternative resides in reversing the polarity of the anode and cathode and the conductivity type of the respective regions. In such instance, for example, the pinch region 26 would then be P+, and a negative potential would be applied to it to cause the device to turn off. This variation is not practical for present automotive applications but might be of use in future or other applications.

The embodiments of the invention in which an exclusive property or privilege is claimed are defined as follows:

1. A gate-controlled thyristor that not only has an IGFET for turn-on but also an IGFET and a variable resistance effect for turn-off, the thyristor comprising:
   a semiconductor body containing integrated bipolar PNP and NPN transistors that form a thyristor;
   the PNP transistor collector region having a portion overlapped, in a direction parallel to the direction of hole current flow in the PNP transistor collector region, by a portion of the NPN transistor collector region that is of higher conductivity than other portions thereof and the overlapped portion of the PNP transistor collector region, for producing a PN junction space charge region effect that restricts flow through the PNP transistor collector region;
   an insulated gate electrode on said body, extending from emitter to collector regions of the NPN transistor, so as to form an integral enhancement type n-channel IGFET electrically in parallel with the NPN transistor emitter and collector regions;
   an electrode on the PNP transistor emitter region, for applying an electrical potential thereto that is positive in Polarity with respect to an electrical potential applied to the NPN transistor emitter region; and
   an electrode on the NPN transistor emitter region, for applying an electrical potential thereto that is negative in polarity with respect to an electrical potential applied to the PNP transistor emitter region;
   means for applying an electrical potential, that is positive in polarity with respect to the electrical potential applied to the NPN transistor emitter region, to the higher conductivity portion of the NPN transistor collector region, effective to produce a space charge region in the overlapped portion of the PNP transistor collector region that will inhibit current flow therethrough;
   whereby, after the aforesaid electrode potentials are applied to said emitter region electrodes, an electrical potential that is positive with respect to the NPN transistor emitter potential can be applied to the gate electrode of the IGFET to turn on the thyristor, and thereafter applied to the higher conductivity type region of the NPN transistor collector region to turn off the thyristor.

2. A gate-controlled thyristor that not only has an IGFET for turn-on but also an IGFET and a space charge region effect for turn-off, the thyristor comprising:
   a semiconductor body containing integrated bipolar PNP and NPN transistors that form a thyristor;
   the collector region of one of the transistors having a portion overlapped, in a direction parallel to the direction of current flow in that collector region, by a portion of the collector region of the other transistor that is of higher conductivity than either the overlapped one transistor collector portion or the majority of the remaining portions of the other transistor collector region, to produce a PN junction separates the two collector regions and, if reversely biased, can inhibit majority carrier current flow through the collector region of said one transistor;
   means for applying an electrical potential to the higher conductivity portion of the other transistor collector region for reversely biasing the PN junction;
   an insulated gate electrode on said body, extending from emitter to collector regions of the other transistor, so as to form an integral IGFET electrically in parallel with the other transistor emitter and collector regions that is non-conducting unless a gate potential is applied to it that is similar in polarity to that applied to the higher conductivity portion of the other transistor collector region;
   an electrode on the one transistor emitter region for applying an electrical potential thereto that is similar in polarity to that applied to the higher conductivity portion of said other transistor collector region; and
   an electrode on the other transistor emitter region for applying an electrical potential thereto that is opposite in polarity from that applied to the higher conductivity portion of said other transistor collector region;
   whereby, after the aforesaid electrical potentials are applied to said emitter region electrodes, an electrical potential similar in polarity to that applied to the one transistor emitter region can be applied to the gate electrode of the IGFET to turn on the thyristor and thereafter said similar polarity electrical potential can be applied to the higher conductivity portion of said other transistor collector region to turn off the thyristor.

3. A gate-controlled thyristor that not only has an IGFET for turn-on but also an IGFET and a pinch resistor for turnoff, the thyristor comprising:
- a semiconductor body containing integrated bipolar PNP and NPN transistors that form a thyristor; for producing an integral pinch resistor that can pinch off hole current flow through the PNP transistor collector region;
- a first insulated gate electrode on said body, extending from emitter to the higher conductivity portion of the NPN transistor collector region, so as to form a first integral enhancement type n-channel IGFET electrically in parallel with the NPN transistor emitter and collector regions;
- a P-type island-like region disposed within the PNP transistor base region, noncontiguous the PNP transistor emitter region;
- an N-type island-like region wholly within the P-type island-like region;
- a low resistance electrical connection between said N-type island-like region and the PNP transistor emitter region;
- a second insulated gate electrode on said body extending from the higher conductivity portion of the NPN collector region to the N-type island-like region, so as to form a second integral enhancement type n-channel IGFET electrically in parallel with the PNP transistor emitter region and the higher conductivity portion of the NPN transistor collector region;
- an electrode of the PNP transistor emitter region; and
- an electrode of the NPN transistor emitter region;
- effective, after applying appropriate electrical potentials to the PNP transistor and NPN transistor emitter electrodes, to allow a voltage applied to the gate electrode of the first IGFET to turn on the thyristor by latching the PNP and NPN transistors, and to allow a voltage applied to the gate of the second IGFET to turn off the thyristor by both shunting base drive away from the PNP transistor and pinching off base drive to the NPN transistor.

4. A thyristor having two insulated control gates, one for thyristor turn-on and one for turn-off, without requiring change of anode or cathode potentials, the thyristor comprising:
- a semiconductor body containing successive, contiguous P,N,P and N conductivity-type regions that provide three successive PN junctions in the body and form a controlled rectifier in the body;
- a portion of the second-mentioned P-type region being of a predetermined maximum dimension in a direction perpendicular to the direction of current flow in the thyristor and having at least one more highly doped portion of the first-mentioned N-type region at least partially encircling it in a plane perpendicular to the direction of current flow in the thyristor for producing a current flow pinch effect on said portion of said second-mentioned P-type region;
- a P-type region in the first-mentioned N-type region that is in addition to and not contiguous the first-mentioned P-type region, thereby forming an additional PN junction with the first-mentioned N-type region;
- an N-type island-like region wholly within the additional P-type region;
- an anode contacting the first-mentioned P-type region, for applying an electrical potential thereto that forward biases the PN junction between that region and its contiguous N-type region;
- an electrode contacting the N-type island-like region;
- a low resistance electrical connection between the N-type island-like region and the anode, for maintaining the N-type island-like region at anode potential during rectifier operation;
- a cathode contacting the second-mentioned N-type region for applying an electrical potential thereto that is opposite in polarity to that applied to the first-mentioned P-type region;
- a first field effect electrode insulatingly disposed on the second-mentioned P-type region and providing an electrical gate between the first and second N-type; ahd
- a second field effect electrode insulatingly disposed on the additional P-type region and providing an electrical gate between the additional N-type island-like region and the first-mentioned N-type region that can shunt electron current to the anode;
- whereby a control voltage applied to the first field effect electrode will turn on the thyristor when a suitable voltage difference exists between its anode and cathode, and alternatively a voltage applied to the second field effect electrode will rapidly turn off the thyristor without requiring a change in anode or cathode voltages.

5. A dual gate thyristor that not only has low on-resistance but also has rapid turn-off even while maintaining voltages applied to its anode and cathode, the thyristor comprising:
- a semiconductor body containing integrated bipolar PNP and NPN transistors in which the base and collector of the PNP transistor respectively also form the collector and base of the NPN transistor to form a bipolar regenerative switching device;
- a P-type emitter region centrally disposed on a base region surface of the PNP transistor;
- an additional P-type region in the PNP transistor base region, surrounding an N-type shunt region;
- a nonplanar PN junction separating the PNP transistor base and collector regions, with a central portion of the nonplanar PN junction being aligned under the centrally disposed emitter region and substantially completely surrounded by a lower resistivity portion of the PNP transistor base-NPN transistor collector region in a plane substantially perpendicular to the direction of current flow in the PNP transistor collector-NPN transistor base region;
- an anode on the PNP transistor emitter region having an integral extension that selectively makes contact with the N-type shunt region but not its surrounding additional P-type region;
- a cathode on the NPN transistor emitter region;
- a dielectric film on the body extending from the NPN transistor emitter region to the lower resistivity portion of the NPN transistor collector-PNP transistor base region;
- a turn-on electrode on the dielectric film for forming a first conductive N-type channel beneath the dielectric film between the NPN transistor emitter and collector regions;
- an internal resistance in the PNP transistor collector-NPN transistor base region between the nonplanar PN junction and the NPN transistor emitter region, which resistance is significant compared to conduction characteristics of the first channel;

a dielectric film on the body extending from the lower resistivity portion of the NPN transistor collector-PNP transistor base region to the N-type shunt region; and a turn-off electrode on the dielectric film for forming a second conductive N-type channel beneath the dielectric film from the lower resistivity portion of the NPN transistor collector-PNP transistor base region to the N-type shunt region;

whereby a positive voltage applied to the turn-on electrode can induce a latch-up of the transistors for regenerative switching and a positive voltage applied to the turn-off electrode not only suppresses such latch-up but also forms a space charge region adjacent the nonplanar PN junction that pinches off hole flow across the surrounded central portion of the nonplanar PN junction.

6. A gate-controlled thyristor that not only has an IGFET for turn-on but also an IGFET and a pinch resistor for turn-off, the thyristor comprising:

a semiconductor body containing integrated bipolar PNP and NPN transistors that form a thyristor;

the PNP transistor having a transverse cross-sectional portion of its collector region encircled by a ring-like portion of its base at the collector-base interface, so as to form a potential integral pinch resistor therebetween that could restrict hole current flow into the encircled portion;

an insulated gate electrode on said body, extending from emitter to collector regions of the NPN transistor, so as to form a first integral n-channel IGFET electrically in parallel with the NPN transistor emitter and collector regions;

a P-type island-like region disposed within the PNP transistor base region, noncontiguous the PNP transistor emitter region;

an N-type island-like region wholly within the P-type island-like region;

an electrical shunt between the N-type region and the PNP transistor emitter region;

an insulated gate electrode on the body extending from the N-type region to the PNP transistor base region, so as to form a second integral n-channel IGFET electrically in parallel with the PNP transistor emitter and base regions;

an electrode on the PNP transistor emitter region; and an electrode on the NPN transistor emitter region;

effective to allow a voltage on the first gate electrode of the IGFET to turn on the thyristor by latching the PNP and NPN transistors, and to allow a voltage on the gate of the second IGFET to turn off the thyristor by both shunting base drive away from the PNP transistor and pinching off base drive to the NPN transistor.

7. A gate-controlled thyristor that not only has an IGFET for turn-on but also an IGFET and a space charge region effect for turn-off, the thyristor comprising:

a semiconductor body containing integrated bipolar PNP and NPN transistors that form a thyristor;

the collector region of one of the transistors having a portion overlapped, in a direction parallel to the direction of current flow in that collector region, by a portion of the collector region of the other transistor that is of higher conductivity than either the overlapped one transistor collector portion or the majority of the remaining portions of the other transistor collector region, to produce a PN junction that separates the two collector regions, and, if reversely biased, can inhibit majority carrier current flow through the collector region of said one transistor;

a first insulated gate electrode on said body, extending from the emitter region of the other transistor to the higher conductivity collector portion of the other transistor, so as to form a first integral IGFET electrically in parallel with the other transistor emitter and collector regions that is non-conducting unless a gate potential is applied to it;

a second insulated gate electrode on said body, extending from the higher conductivity collector portion of the other transistor, to a discrete region disposed in the remaining portions of the other transistor collector region, which discrete region is separated from said remaining portions of the other transistor collector region by a high electrical resistance, so as to form a second integral IGFET that is non-conducting unless a gate potential is applied to it;

a low resistance electrical connection between said discrete region of said second IGFET and the emitter region of the one transistor, effective to maintain said discrete region at essentially the same electrical potential applied to the one transistor emitter region;

an electrode on the one transistor emitter region for applying an electrical potential thereto that is opposite in polarity to that applied to the other transistor to emitter region;

an electrode on the other transistor emitter region for applying an electrical potential thereto that is opposite in polarity from that applied to the one transistor emitter region;

whereby, after the aforesaid electrical potentials are applied to said emitter region electrodes an electrical potential similar in polarity to that applied to the one transistor emitter region can be applied to the first gate electrode to turn on the thyristor and thereafter said similar polarity electrical potential can be applied to the second gate electrode to turn off the thyristor.

* * * * *